United States Patent

Miki et al.

[11] Patent Number: 6,129,098
[45] Date of Patent: Oct. 10, 2000

[54] APPARATUS FOR INJECTING CONSTANT QUANTITATIVE CHEMICALS AND A METHOD THEREOF

[75] Inventors: Nobuhiro Miki; Takahisa Nitta, both of Tokyo; Tadahiro Ohmi, Miyagi-ken; Nobukazu Ikeda; Naofumi Yasumoto, both of Osaka-fu, all of Japan

[73] Assignees: Kabushiki Kaisha Ultraclean Technology Research Institute; Fujiken, Inc., both of Osaka-fu, Japan

[21] Appl. No.: 09/139,500

[22] Filed: Aug. 25, 1998

[30] Foreign Application Priority Data

Aug. 29, 1997  [JP]  Japan .................................. 9-234721

[51] Int. Cl.$^7$ ...................................................... B08B 3/02
[52] U.S. Cl. .................. 134/56 R; 134/99.2; 134/100.1; 222/53; 222/630
[58] Field of Search ........................ 222/53, 630, 145.1, 222/145.7; 134/100.1, 99.2, 56 R; 137/101.11, 205.5, 209, 206

[56] References Cited

U.S. PATENT DOCUMENTS

| | | | |
|---|---|---|---|
| 2,604,108 | 7/1952 | Considine | 137/209 |
| 2,619,107 | 11/1952 | Graham | 137/209 |
| 3,894,662 | 7/1975 | Eddy et al. | 222/193 |
| 5,000,844 | 3/1991 | Cloup | 210/94 |
| 5,484,106 | 1/1996 | Gilmond | 239/317 |

FOREIGN PATENT DOCUMENTS

| | | | |
|---|---|---|---|
| 1-231984 | 9/1989 | Japan | C02F 1/00 |
| 2-56293 | 2/1990 | Japan | C02F 1/00 |
| 3-165519 | 7/1991 | Japan | H01L 21/305 |
| 3-205824 | 9/1991 | Japan | H01L 21/304 |
| 4-354334 | 12/1992 | Japan | H01L 21/304 |
| 5-11458 | 1/1993 | Japan | G03F 7/32 |
| 5-13395 | 1/1993 | Japan | H01L 21/304 |
| 5-7705 | 1/1993 | Japan | B01D 19/00 |
| 5-7869 | 1/1993 | Japan | C02F 1/30 |
| 5-47734 | 2/1993 | Japan | H01L 21/304 |
| 5-47735 | 2/1993 | Japan | H01L 21/304 |
| 5-104682 | 4/1993 | Japan | B32B 9/00 |
| 5-136114 | 6/1993 | Japan | H01L 21/304 |
| 6-182558 | 7/1994 | Japan | B23K 9/32 |
| 07014817 | 1/1995 | Japan | H01L 21/304 |
| 07058076 | 3/1995 | Japan | H01L 21/304 |
| 07142438 | 6/1995 | Japan | H01L 21/304 |
| 07161672 | 6/1995 | Japan | H01L 21/304 |
| 08187474 | 7/1996 | Japan | B08B 3/08 |
| 08187476 | 7/1996 | Japan | B08B 3/12 |
| 08306655 | 11/1996 | Japan | H01L 21/304 |
| 09010712 | 1/1997 | Japan | B08B 3/12 |
| 09010713 | 1/1997 | Japan | B08B 3/12 |
| 09064146 | 3/1997 | Japan | H01L 21/68 |
| 09194887 | 7/1997 | Japan | C11D 7/00 |
| WO98/01896 | 1/1998 | Japan | H01L 21/304 |

*Primary Examiner*—Frankie L. Stinson
*Attorney, Agent, or Firm*—Randall J. Knuth

[57] ABSTRACT

An apparatus for injecting constant quantitative chemicals which is capable of injecting a chemical solution into ultra pure water without generating particulate contamination, and furthermore, the injection interval of the chemical solution to the cleaning nozzle is controlled in units of seconds within a range of a few seconds to 10 or more seconds, and the switching of the type of chemical solution and the changeover to ultra pure water cleaning can be conducted in a short period of time of approximately 1 second.

The apparatus includes a chemical solution injection system having a chemical solution retaining part for retaining the chemical solution, a control system for pressurization and depressurization for controlling the pressure of the chemical solution in the chemical solution retaining part at regular intervals, an injection control system which operates in concert with the control of the pressure of the chemical solution, and is structured so as to conduct the intermittent injection and instantaneous mixing function of the chemical solution from the chemical solution injection system to the ultra pure water flow path, and the injection stoppage function, and a chemical solution replenishment system which is structured so as to operate in concert with the control of the chemical solution and to be capable of replenishing the chemical solution in the chemical solution retaining part from a chemical solution source.

2 Claims, 4 Drawing Sheets

Fig. 1

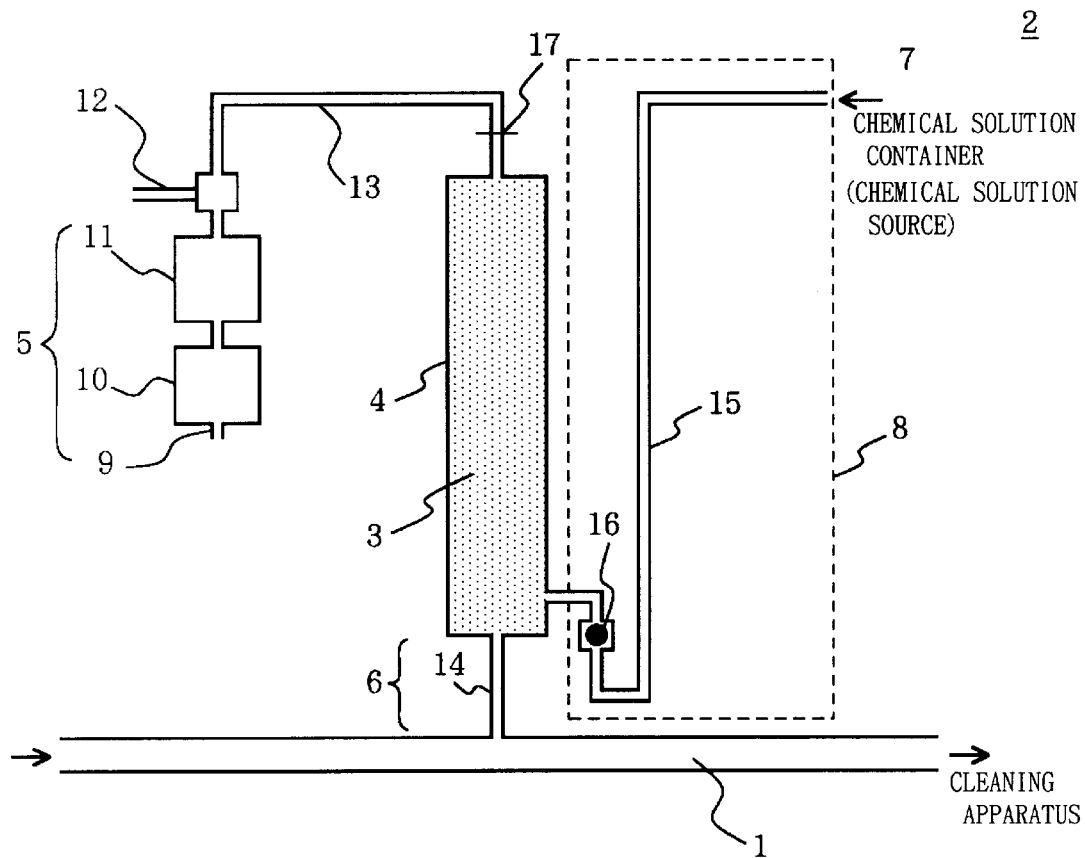

1  ULTRA PURE WATER FLOW PATH
2  APPARATUS FOR INJECTING CONSTANT QUANTINTATIVE CHEMICALS
3  CHEMICAL SOLUTION
4  CHEMICAL SOLUTION INJECTION SYSTEM
5  CONTROL SYSTEM FOR PRESSURIZATION AND DEPRESSURIZATION
6  INJECTION CONTROL SYSTEM
7  CHEMICAL SOLUTION SOURCE
8  CHEMICAL SOLUTION REPLENISHMENT SYSTEM
9  GAS INPUT PORT
10 REGULATOR
11 PRESSURE SENSOR
12 PRESSURE OPENING
13, 15 PIPES
14 CAPILLARIES
16 CHECK VALVE
17 LIQUID LEVEL SENSOR

31 BELLOWS PUMP
32 BELLOWS
33 PISTON ROD
34 LIQUID DRAWOFF PORT

41 TUBE PUMP
42 TUBE
43 ROTATING BODY
44 VESSEL

25 INERT LIQUID

14 CAPILLARY
61 CHECK VALVE

APPARATUS FOR INJECTING CONSTANT QUANTITATIVE CHEMICALS AND A METHOD THEREOF

BACKGROUND OF THE INVENTION AND DESCRIPTION OF RELATED ART

1. Technical Field

The present invention relates to an apparatus for injecting constant quantitative chemicals. In greater detail, the present invention relates to an apparatus for injecting constant quantitative chemicals which is capable of injecting, without creating particulate contamination, a chemical solution into ultra pure water supplied to a single wafer processing type wafer cleaning apparatus which is used in semiconductor device manufacturing processes, for example.

2. Background Art

As the integration of semiconductor devices has increased, the number of cleaning processes has also greatly increased, and the degree of cleanliness is rapidly approaching that of complete cleanliness. Accordingly, techniques for the clean supply of cleaning solution to cleaning apparatuses are increasingly required.

Currently, cleaning solutions become contaminated during the mixing, dilution, and transport processes, and there are no simple technological countermeasures for preventing this.

The present invention involves the development of a clean chemical solution supply apparatus which is required for wafer cleaning, and contributes to an increase in performance of semiconductor devices by increasing cleaning effects.

In order to accommodate the sub-quarter micron era, which requires an increasing degree of cleanliness, an advance in wafer cleaning apparatuses is first required. In order to completely and uniformly clean a wafer with a large diameter, a process chamber direct connection type single wafer cleaning method is required. Here, new problems occur involving the chemical solution supply system to the process chamber direct connection type single wafer cleaning apparatus.

The conventional chemical solution supply technology involves the "large scale preparation method". In other words, the chemical solution was conveyed by means of a pump from a receiving tank to a dilution and mixing tank, the composition and concentrations were adjusted to specified levels, the solution was then transported by means of a pump from the supply tank through long distance piping, was transported by pump to the storage tank of a wet station, and was supplied to a cleaning tank via a pump and a filter.

In this method, it was not easy to prevent particulate contamination from all the structural components, such as the storage tank, the piping, the joints, the valves, the pumps, the flow meters, the flow regulators, and the like; this problem still has not been solved.

In recent years, a method has been employed for chemical solution supply apparatuses to single wafer processing type cleaning apparatuses in which the cleaning solution is directly supplied to a pure water line. However, the supply apparatus comprises a changeover valve and a mixing zone. Such a structure is inappropriate for the high throughput of single wafer cleaning. In order to achieve the high throughput of the single wafer processing cleaning, it is necessary that the chemical solution supplied to the ultra pure water line be instantaneously mixed with the ultra pure water. Moreover, in the changeover valve method, even if the chemical solution is supplied to the pure water line, time is required for the mixing of the chemical solution and the pure water, and for the changeover. Furthermore, because of the occurrence of particles from the valves, completely clean wafer surface processing is impossible.

A new technology employing capillaries in the chemical solution injecting mechanism has been disclosed in Japanese Patent Application No. HEI 8-21557. By means of this technology, the problem of the instantaneous mixing of the chemical solution and the pure water described above is solved. However, apart from causing the capillaries to simply function as the junction points between the chemical solution and the pure water, there has been no development at the present time with respect to causing such capillaries to operate as system functional elements.

OBJECT AND SUMMARY OF THE INVENTION

The first object is to improve the chemical solution supply apparatus so as to form a compact "direct injection method", in order to leave behind the "large scale preparation method" which was the conventional chemical solution supply technology for wet stations, and in order to move to the era of the process chamber direct connection type single wafer processing type wafer cleaning apparatus. In other words, this involves the development of a method in which the base of the chemical solution is directly injected into the ultra pure water flow path of a wafer cleaning apparatus and the like.

A second object is the "complete cleanliness" of the chemical solution injection system. The injection system is directly coupled with the wafer surface. The development of a chemical solution injection apparatus which does not give rise to particulate contamination is a necessary goal.

A third object is the development of an "instantaneous reaction type" which is appropriate for the single wafer processing wafer cleaning throughput. In single wafer processing wafer cleaning, the cleaning sequence occurs at intervals measured in seconds, from a few seconds to 10 seconds or more. Furthermore, the switching of the type of chemical solution, the changeover to ultra pure water cleaning, and the like, must be carried out in a short period of approximately one second.

The present invention has as an object thereof to provide an apparatus for injecting constant quantitative chemicals which is capable of the direct injection of a base of a chemical solution into an ultra pure water flow path of, for example, a wafer cleaning apparatus, and which enables the chemical solution supply apparatus to be made compact.

The present invention has as an object thereof to provide an apparatus for injecting constant quantitative chemicals which is capable of injecting a chemical solution into ultra pure water without creating particulate matter.

The present invention has as an object thereof to provide an apparatus for injecting constant quantitative chemicals in which the injection interval of the chemical solution to the cleaning nozzle is controlled in second units, from a few seconds to ten seconds or more, and in which the switching of the type of chemical solution, the changeover to ultra pure water cleaning, and the like, can be carried out in a short period of time of approximately one second.

The apparatus for injecting constant quantitative chemicals of the present invention is an apparatus for injecting constant quantitative chemicals, which serves to inject various chemical solutions into an ultra pure water flow path for supplying ultra pure water to a single wafer cleaning apparatus, which conducts the cleaning of the surfaces of materials to be cleaned in a single wafer processing manner, which is provided with:

a chemical solution injecting system having a chemical solution retaining part for retaining chemical solutions, a [system for controlling pressurization and depressurization] which serves to control the pressure of the chemical solution retaining part at standard intervals, an [injection control system] which is structured so as to operate in concert with the control of the pressure of the chemical solution, and to conduct the intermittent injection of chemical solution into the ultra pure water flow path from the chemical solution injection system and the instantaneous mixing operation, and to conduct the cessation of injection, and a [chemical solution replenishment system] which is structured so as to operate in concert with the control of the chemical solution and so as to accomplish the replenishment of the chemical solution in the chemical solution retaining part from a chemical solution source.

The method for injecting constant quantitative chemicals in accordance with the present invention is a method for injecting constant quantitative chemicals in which various chemical solutions are injected in an instantaneous manner and at constant amounts into an ultra pure water flow path, which serves to supply ultra pure water to a single wafer cleaning apparatus, which conducts the cleaning of the surfaces of materials to be cleaned in a single wafer processing manner, and in which cleaning solutions which have highly precise and uniform compositions are supplied to a cleaning nozzle, wherein:

the pressure of the cleaning solution within the cleaning solution retaining part is controlled at constant intervals, in concert with the control of the pressure of the chemical solution, the intermittent injection of chemical solution into the ultra pure water flow path from the chemical injection system, the instantaneous mixing thereof, and the cessation of injection are conducted, and the chemical solution in the chemical solution retaining part is replenished from a chemical solution source in concert with the control of the chemical solution.

In the present invention, first, in order to inject chemical solution at a constant speed and at constant intervals into the ultra pure water flow path, four systems are provided: the [control system for pressurization and depressurization] and the [chemical solution injection system] which operates in concert therewith, the [injection control system] in which an injection mechanism which causes the instantaneous mixing of the ultra pure water and the chemical solution simultaneously with the injection of the chemical solution is combined with an injection intermittent mechanism, and the [chemical solution replenishment system] which conducts the replenishment of the chemical solution. By means of the pressure balancing of these four systems, it is possible to control the injection of constant quantitative chemicals.

In the present invention, second, since operation is conducted completely by means of pressure balancing during the ON/OFF of the injection of the chemical solution into the ultra pure water flow path and during the ON/OFF of the replenishment of the chemical solution in the chemical solution retaining part, no sources of particulate contamination, such as valves and the like, are used.

In other words, the chemical solution is pressurized and moved by means of a [control system for pressurization and depressurization] which does not give rise to particulate contamination, and injection into the ultra pure water flow path is carried out by means of an injection control system for chemical solutions which does not give rise to particulate contamination. Concretely, this means either that there are no parts which rub against one another in the [control system for pressurization and depressurization], or, when parts which rub against one another are present, an indirect pressure transmission structure is employed in which this is isolated from the [chemical solution injection system], or alternatively, a removal mechanism is provided for the contamination resulting from the friction, and additionally, switch valves having parts which rub against one another are not employed.

For this reason, it is possible to inject chemical solution into the ultra pure water flow path without giving rise to particulate contamination, and it is possible to supply a cleaning solution which does not contain sources of contamination such as particles or the like to the cleaning nozzle or the cleaning tank, and additionally, it is possible to achieve a high level of cleanliness.

Thirdly, in the present invention, the use of an [injection control system] which is structured so as to conduct, in concert with the control of the pressure of the chemical solution, the intermittent injection of chemical solution from the chemical solution injection system into the ultra pure water flow path, the instantaneous mixing thereof, and the cessation of injection, is an important feature.

It is preferable that capillaries be employed as the injection control system.

With respect to the mechanism for injecting chemical solution into the ultra pure water flow path, in the case in which chemical solution is supplied to the ultra pure water flow path via piping from the chemical solution retaining part by a pump and via valves, there is a response delay in the cleaning solution concentration when solution is supplied, as a result of the dead space of the valves. Furthermore, particles are generated by the opening and closing of the valves.

Moreover, when valves are not employed, and the chemical solution retaining part and the ultra pure water flow path are connected using capillaries, this is extremely effective for solving the problem described above.

Here, it is preferable that the shape of the capillaries be set so as to meet the conditions described below.

Chemical solution injection speed:

$$V/t = (\pi r^4 \cdot P \cdot G)/(8\eta \cdot L) \qquad \text{(Formula 1)}$$

Chemical solution component dispersion rate:

$$k \cdot c \cdot \pi r^2 / L < 1 \times 10^{-7} \text{ g/sec} \qquad \text{(Formula 2)}$$

Here,

V/t: chemical solution injection amount per unit time ($cm^3$/sec), r: radius of the capillaries (cm), L: length of the capillaries (cm), $\eta$: fluid viscosity (g/(cm sec)), P: injection pressure ($g/cm^2$), G: gravitational acceleration ($cm/sec^2$), k: dispersion constant ($cm^2$/sec), c: cleaning solution component concentration ($g/cm^3$).

Effect (1) provided by the capillaries is instantaneous responsiveness. In the conventional injection mechanisms comprising changeover valve structures and joints, instantaneous responsiveness of injection and an intermittent time period measured in units of seconds were impossible. In contrast, switching which is conducted by capillaries directly connected to the ultra pure water flow path has no dead space, so that there is absolutely no time lag.

Effect (2) of the capillaries is instantaneous mixing. The spray rate of the chemical solution into the ultra pure water flow path from the capillaries is high, and this contributes to the instantaneous mixing effect within the pipe. That is to say, uniform mixing of various types of chemical solutions can be achieved without the necessity of providing a mixing process.

Effect (3) provided by the capillaries is the back flow of minute amounts. During injection stoppage periods, the chemical solution isolation resulting from the capillaries functions in the following manner. As a result of the difference in pressure between the pressure within the chemical solution injection system and the water pressure of the ultra pure water flow path, a minute amount of ultra pure water flows back into the capillaries. The amount of this back flow can be controlled in proportion to the difference in pressure, so that by means of this back flow, it is possible to maintain the degree of dilution of the chemical solution within allowable ranges. As a result of this back flow, the chemical solution injection system and the ultra pure water flow path are completely isolated from one another.

As a result, it is possible to inject chemical solution into the cleaning nozzle at a constant speed, and furthermore, if a plurality of chemical solution injection systems for differing chemical solutions are provided, it is possible to conduct the switching of types of chemical solutions at standard intervals, and additionally, the switching of the interval between the supply of the ultra pure water and the supply of the cleaning solution (ultra pure water containing the chemical solution) and the like can be conducted in a short period of one second or less.

In the present invention, ultra pure water is preferentially employed which has the qualities listed in Table 1 below.

TABLE 1

| | |
|---|---|
| Electrical Resistivity | 18.2 MΩ° cm or more |
| Total Organic Carbon | 1 μgC/liter or less |
| Microparticle Count | 1 particle/ml or less (particle diameter of 0.05 μm or more) |
| Microbe Count | 1 perticle/liter or less |
| Dissolved Oxygen | 5 μgO/liter or less |
| Silica | 0.1 μgSiO$_2$/liter or less |
| Sodium | μgNa/liter or less |
| Iron | 0.001 μgFe/liter or less |

Effects of the Invention

By means of the present invention, the following effects are obtained.

It is possible to inject chemical solution directly into the ultra pure water flow path, and it is possible to make the chemical solution supply apparatus compact.

It is possible to inject chemical solution into the ultra pure water in a manner which causes no particulate contamination.

It is possible to conduct the injection of chemical solution at constant speeds to the cleaning nozzle at intervals within a range of a few seconds to 10 or more seconds, and to conduct the switching of the type of chemical solution and the switching to ultra pure water cleaning and the like in short periods of time of approximately one second.

BRIEF DESCRIPTION OF THE DIAGRAMS

FIG. 1 is a schematic system diagram of an apparatus for injecting constant quantitative chemicals in accordance with embodiment 1.

Figure 2:
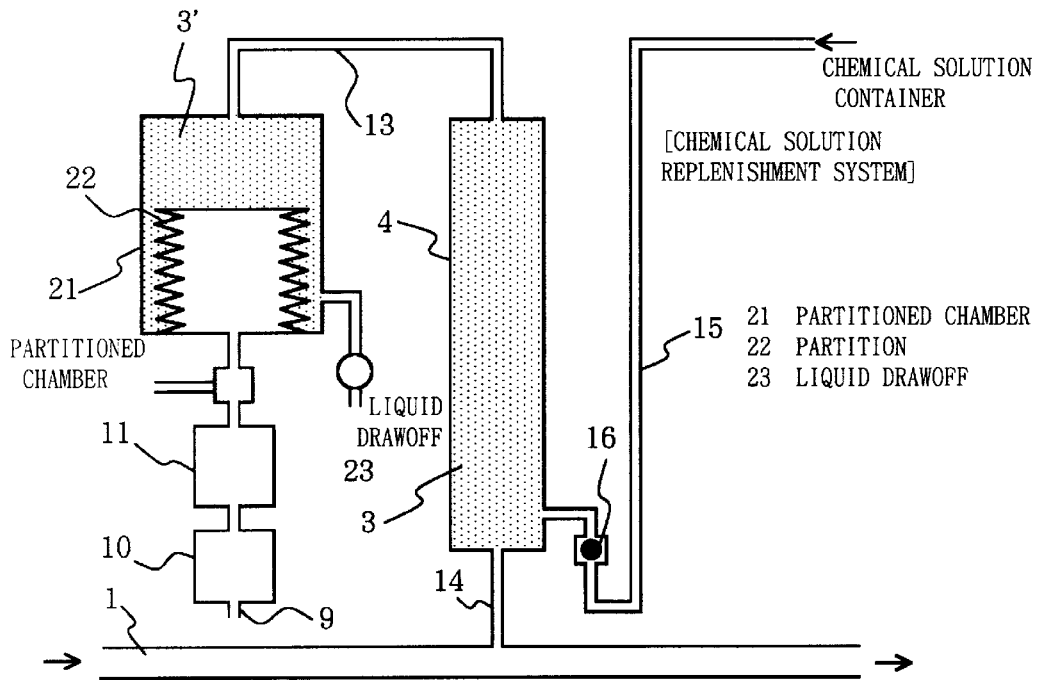
FIG. 2 is a schematic system diagram of an apparatus for injecting constant quantitative chemicals in accordance with embodiment 2.

DESCRIPTION OF THE REFERENCES 1 ultra pure water flow path,
2 apparatus for injecting constant quantitative chemicals,
3 chemical solution,
4 chemical solution injection system,
5 control system for pressurization and depressurization,
6 injection control system, 7 chemical solution source,
8 chemical solution replenishment system,
9 gas input port, 10 regulator, 11 pressure sensor,
12 pressure opening, 13 pipe, 14 capillaries,
15 pipe, 16 check valve, 17 liquid level sensor,
21 partitioned chamber, 22 partition, 23 liquid drawoff,
24 inert liquid chamber, 25 inert liquid, 26 pipe,
31 bellows pump, 32 bellows, 33 piston rod,
34 liquid drawoff port, 41 tube pump, 42 tube,
43 rotating body, 44 vessel, 61 check valve.

DETAILED DESCRIPTION OF PREFERRED EMBODIMENTS OF THE INVENTION

The details of the present invention will be explained hereinbelow based on embodiments of the invention.

In all the embodiments described below, the level of particles in the cleaning solution during injection of the chemical solution in the chemical solution supply system is completely identical to the level of particles in the ultra pure water prior to injection of the chemical solution.

EMBODIMENT 1

An apparatus for injecting constant quantitative chemicals in accordance with a first embodiment of the present invention is shown in FIG. 1.

In this embodiment an apparatus for injecting constant quantitative chemicals 2 for injecting various chemical solutions 3 into an ultra pure water flow path 1 which serves to supply water to a single wafer processing type cleaning apparatus (not depicted in the figure) which conducts the cleaning of the surfaces of materials to be cleaned in a single wafer processing manner, is provided with: a chemical solution injection system 4 having a chemical solution retaining part for retaining chemical solution 3, a [control system for pressurization and depressurization] 5 for controlling the pressure of the chemical solution 3 of the chemical solution retaining part at standard intervals, an [injection control system] 6 which is structured so as to act in concert with the control of the pressure of chemical solution 3 and so as to carry out the intermittent injection of chemical solution 3 from chemical injection system 4 into ultra pure water flow path 1, the instantaneous mixing thereof, and the cessation of injection, and a [chemical solution replenishment system] 8 which is structured so as to act in concert with the control of chemical solution 3 and so as to be capable of replenishing the chemical solution in the chemical solution retaining part from a chemical solution source 7.

Hereinbelow, the present embodiment will be explained in detail.

In the present embodiment, control system for pressurization 5 comprises a gas inlet port 9, a regulator 10, a pressure sensor 11, and a gas opening 12 which is connected thereto.

A regulator which has the function of maintaining the gas pressure at a constant set value may be employed as regulator 10.

Furthermore, a semiconductor pressure sensor, for example, may be employed as pressure sensor 11.

It is preferable that the point of connection between pipe 13 and the chemical solution retaining part 4 be in the upper part of chemical solution retaining part 4 in the figure. Furthermore, the inner diameter of pipe 13 is preferably set within a range of 1–3 mm in order to allow for rapid pressure response.

There is also a chemical solution injection system which is connected with the control system for pressurization 5 by pipe 13. In the present embodiment, chemical solution injection system 4 comprises the chemical solution retaining part.

The chemical solution retaining part should be a vessel constructed of a material which is resistant to the chemical solution employed and which does not cause metallic component or particulate contamination. Highly pure ceramics, carbon, fluorine resins, or metals subjected to surface passivation may be employed, and quartz may be employed with respect to chemical solutions other than hydrofluoric acid.

No particular limitations are made with respect to the size of the container; however, the length thereof may be within a range of 50–300 mm, and the diameter thereof may be within a range of 10–30 mm, for example. When such dimensions are employed, the responsiveness of the pressure control by the control system for pressurization is good.

In the present embodiment, the chemical solution injection system 4 and the ultra pure water flow path are connected by means of a capillary. In other words, capillary 14 is employed as the injection control system.

In the present embodiment, the [injection control system] comprises a capillary directly connected to the ultra pure water flow path, and the control of the chemical solution injection is accomplished using the control function of the injection speed resulting from the internal pressure of the chemical solution injection system of the [control system for pressurization and depressurization], the resistance to water flow within the capillary, and the water pressure balance of the ultra pure water flow path, the instantaneous mixing function resulting from the spraying effects of the chemical solution from the capillary into the ultra pure water flow path, the instantaneous stoppage effects of the capillary during the cessation of chemical solution injection, and the chemical solution isolation effects resulting, during the replenishment of the chemical solution, from the back flow effects of small amounts of ultra pure water into the capillary resulting from the difference in pressure between the pressure of the chemical solution replenishment pressure and the water pressure within the ultra pure water flow path.

With respect to these capillaries, it is possible to select the dimensions thereof while preserving the formula (1) which sets up the relationship to the chemical solution injection speed. For example, when the injection speed V/t is 1.0 ml/sec, when the injection pressure P is controlled at a level of 5.3 kg/cm$^2$, an arbitrary capillary radius R and length L may be employed which satisfy the value of [r$^4$/L] in formula (1), and an example thereof is a capillary diameter 2r of 0.24 mm and a length L of 50 mm. When the injection pressure P is controlled at the low level of 0.25 kg/cm$^2$, the capillary diameter 2r=0.50 mm and length L=40 mm, which satisfy the value of [r$^4$/L] in formula (1) in the same manner, may be employed. With respect to the material of the capillaries, highly pure ceramic, carbon, fluorine resin, metal subjected to surface passivation, or quartz or the like may be employed, and the inner surface thereof should be as smooth as possible.

The linear speed of the chemical solution sprayed from the capillaries is, at an chemical injection speed of 1.0 ml/sec, 20 m/sec or 5 m/sec, respectively, at capillary diameters of 0.25 mm and 0.50 mm. On the other hand, the linear speed of the water when an ultra pure water supply of 6 liters per minute is conducted in piping having an inner diameter of 10 mm is approximately 1 m/sec (approximately 80 ml/sec). The high spray speed from the capillaries causes the instantaneous mixing effect.

In order to confirm this effect, a Y shaped branch was provided at the ultra pure water pipe outlet, and while altering the branch angle, the flow path was bifurcated and the dilution concentration was assayed; it was impossible to detect a difference in composition between the divided solutions within detectable limits, and it thus clear that an apparatus for the purposes of mixing is not required in the injection mechanism.

A chemical solution replenishment system 8 is connected to the chemical solution injection system. The connection thereof is accomplished by means of pipe 15. A check valve 16 is provided in pipe 15.

Next, the operational procedure of the apparatus for injecting constant quantitative chemicals will be explained.

With respect to the case of continuous cleaning of wafers at 60 second intervals using a single wafer processing type cleaning apparatus, the sequence which will be discussed is one in which chemical solution A was injected at a speed of 1.0 ml/sec for a period of 20 seconds, while the remaining 40 seconds were used for replenishment of the chemical solution. The capillaries had a diameter of 0.25 mm and a length of 50 mm, and the water pressure of the ultra pure water flow path into which injection was conducted was 0.20 kg/cm$^2$. The pressure balance of the injection system at this time is shown in table 2. In other words, the pressure regulator 10 and the pressure sensor 11 of the control system for pressurization and depressurization were set to pressurization conditions of 5.5 kg/cm$^2$, the chemical solution injection system was pressurized for 20 seconds, and for the remaining 40 seconds, the gas opening 12 was opened, and the pressure was released. In a period of 20 seconds, 20 ml of the chemical solution A within the chemical solution retaining part passed through the capillary and was pressure injected into the ultra pure water flow path.

After 20 seconds, as a result of the closing of the gas input port 9 on the one side of the control system for pressurization and depressurization and the opening of the pressure opening 12 on the second side, the pressure in the chemical solution injection system is released, and the check valve 16 of the chemical solution replenishment system 8 connected thereto is opened, and chemical solution A flows from the container, which has been maintained in a pressurized state, through pipe 15, and into the chemical solution retaining part. It is preferable that the pressure maintained in the container be approximately 0.10 kg/cm$^2$, and furthermore, pipe 15 should be set to an inner diameter and length such that 20 ml of the chemical solution A can flow through the pipe in a period of time somewhat shorter than 40 seconds. When the liquid level position reaches the liquid level sensor 17 which is positioned in the chemical solution retaining part upper pipe 15, the pressurization of the container is released as a result of the sensor signal.

As shown in Table 2, as a result of a difference in pressure of approximately 0.20 kg/cm$^2$ between the ultra pure water flow path and the chemical solution level during the chemical solution replenishment, ultra pure water flows into the chemical solution retaining part through the capillaries, and the chemical solution is thus isolated from the ultra pure water flow path. The amount thereof is slight, at approximately 1.5 ml/40 seconds; however, in those cases in which the degree of dilution of chemical solution A is affected by this, a mechanism can be adopted for correcting this problem by increasing the injection speed of chemical solution A in a manner equivalent to the dilution ratio.

TABLE 2

Total System Pressure Balance During Chemical Solution Injection and During Chemical Solution Replenishment

| | Flow Rate | Control System for Pressurization and Depressurization kg/cm$^2$ | Chemical Solution Injection System kg/cm$^2$ | Capillary Resistance kg/cm$^2$ | Ultra-pure Water Flow Path kg/cm$^2$ | Chemical Solution Replenishment System kg/cm$^2$ |
|---|---|---|---|---|---|---|
| During Chemical Solution Injection | Chemical Solution 20 ml/20 sec | 5.50 | 5.50 | 5.30 | 0.20 | Check Valve Closed |
| During Chemical Solution Replenishment | Chemical Solution 20 ml/40 sec | Pressure Released | Pressure Released | 0.20 | 0.20 | 0.10 |

Next, a structural example involving the simultaneous injection of a plurality of chemical solutions will be explained. A number of branches equivalent to the types of chemical solutions is provided in pipe 13 in the structural diagram shown in FIG. 1, and a plurality of chemical solution injection systems, injection control systems, and chemical solution replenishment systems are connected, and the capillaries of each injection control system are connected to a single ultra pure water flow path. The various chemical solution injection periods are identical; however, the injection speeds differ, so that at a common injection pressure, it is of course the case that capillaries should be selected in accordance with the injection speeds of the various chemical solutions.

Furthermore, an applied example of the chemical solution replenishment will be explained. This is an example which employs a valve in place of the check valve 16 of the chemical solution replenishment system shown in FIG. 1. Using a valve which does not give rise to particulate contamination and which has improved structural materials and an improved opening and closing mechanism, the control of the opening and closing is conducted by means of the liquid level sensor signal, and thereby, it is possible to carry out chemical solution replenishment in a manner identical to that described above. By means of this, a method is realized for maintaining the pressure of the container at a constant level.

EMBODIMENT 2

In the present invention, as shown in FIG. 2, a [partitioned chamber] 21 is provided between the [control system for pressurization and depressurization] 5 and the [chemical solution injection system], and together with the other systems identical to those in the first embodiment, these comprise an apparatus for injecting constant quantitative chemicals.

The interior of partitioned chamber 21 is divided into two chambers by means of the bellows shaped partition 22, and one chamber (the chamber on the chemical solution side) communicates with the chemical solution retaining part, and a chemical solution 3' is retained. The other chamber (the chamber on the gas side) communicates with the pressure sensor 11 side.

When gas is introduced from the pressure sensor 11 side to the gas chamber side of partitioned chamber 21, the bellows shaped partition 22 rises. As a result, the chemical solution 3' within the chamber on the chemical solution side flows into chemical solution retaining part 4 via pipe 13, the chemical solution 3 within chemical solution retaining part 4 enters a pressurized state, and chemical solution 3 is injected into ultra pure water flow path 1 via capillary 14.

When the introduction of the gas is stopped and the pressure opening 12 is opened, the bellows shaped partition 22 lowers, and the inflow of chemical solution 3' into the chemical solution retaining part 4 from the chamber on the chemical solution side is halted, the pressurized state of the chemical solution within chemical solution retaining part 4 is ended, and the injection of chemical solution 3 into ultra pure water flow path 1 is also halted.

In the present example, the gas is completely isolated from the chemical solutions 3 and 3' by means of partition 22, so that there is no mixture of the gas with the chemical solution 3, and it is possible to supply a cleaning solution (a mixture of the chemical solution and ultra pure water) containing no gas to the cleaning device.

In this system, the constant quantitative injection of hydrofluoric acid (having a concentration of 50% HF) is conducted. By means of the partition, the dispersion of hydrogen fluoride gas into the interior of the [control system for pressurization and depressurization] is prevented, and thereby, even if hydrofluoric acid injection is continued for a long period of time, continuous operation is possible without corrosion of the [control system for pressurization and depressurization]. A liquid drawoff port is installed in the [partitioned chamber], and drawoff of hydrofluoric acid is conducted at a flow rate of a few ml/min so that the particles generated in the operation of the partition do not reach the chemical solution injection system.

EMBODIMENT 3

Figure 3:
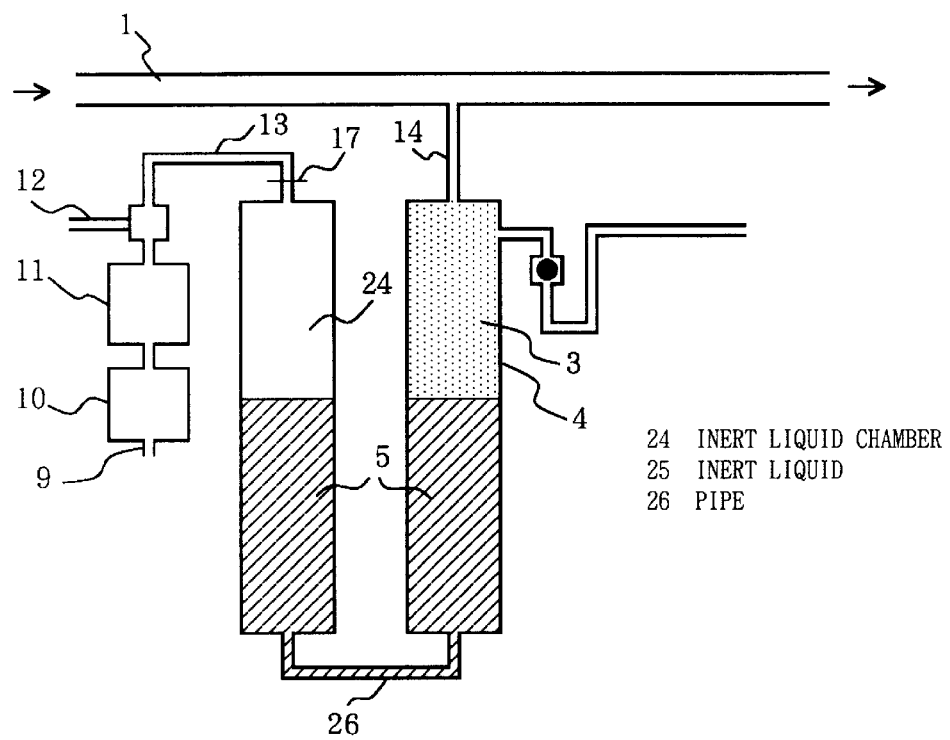
FIG. 3 is a schematic system diagram of an apparatus for injecting constant quantitative chemicals in accordance with embodiment 3.

In the present embodiment, as shown in FIG. 3, in place of the partitioned chamber of the gas control system, an inert liquid chamber 24 is employed; the other details of this apparatus for injecting constant quantitative chemicals are identical to those of embodiment 2.

The gas control system and the inert liquid chamber 24 are connected, and this chamber is filled with a liquid perfluoro compound 25 which is completely immiscible with and nonreactive to the chemical solution, and this is connected with the chemical solution supply system by means of a pipe 26. The density of this liquid is greater than that of the chemical solution, so that the connected positions of the chemical solution supply system, the injection control system, and the chemical solution replenishment system are in vertically reversed order from those in FIG. 2.

With respect to the liquid perfluoro compound, that produced by the 3M Corporation under the brand name Fluorinate, for example, may be employed.

By means of the pressurization brought about by the gas control system, the liquid perfluoro compound 25 flows into the injection control system 4, and the chemical solution above the liquid level thereof is injected into the ultra pure water flow path from the capillary. During replenishment of the chemical solution by means of the release of the gas control system pressure, in concert with the inflow of the chemical solution into the chemical solution retaining part as a result of the pressurization of the chemical solution container, the liquid perfluoro compound 25 returns to the inert liquid chamber 24, and as a result of the signal indicating arrival at the position of liquid level sensor 17, the container pressurization is released.

In this way, it is possible to realize a supply of constant quantitative chemical solutions in the same way as with the partitioned chamber structure.

EMBODIMENT 4

Figure 4:
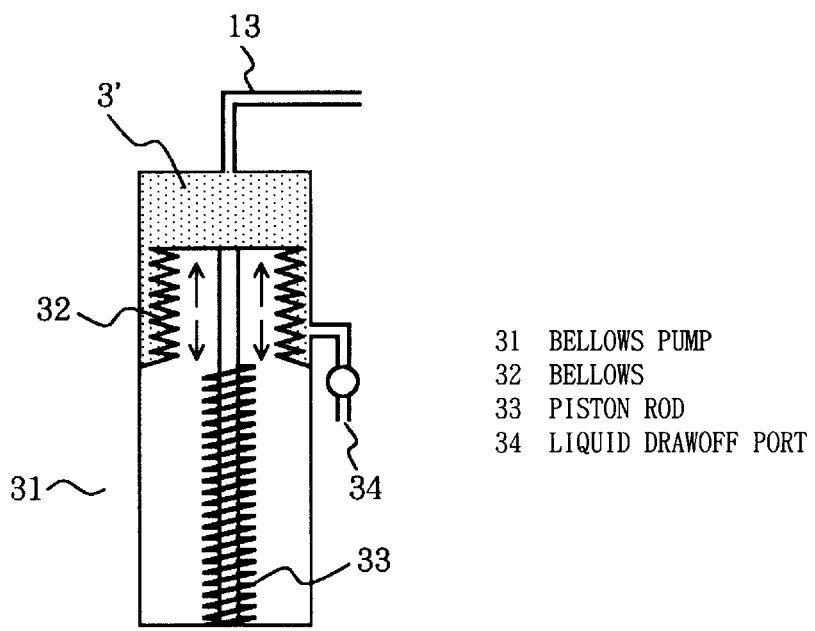
FIG. 4 is a cross sectional view showing the control system for pressurization and depressurization in embodiment 4.

In embodiment 4, as shown in FIG. 4, an open [control system for pressurization and depressurization] comprising a bellows pump 31 is employed.

Bellows pump 31 extends bellows 32 as result of the upwards and downward action of piston rod 33, and, in the same manner as in the case of embodiment 2, chemical solution 3' is introduced to the chemical solution retaining part via pipe 13, and this pressurizes the chemical solution retaining part. The rest of the system is identical to that of embodiment 1.

This device has the following characteristics.

During chemical solution injection, chemical solution is sprayed at a rate of 1.0 ml/sec from bellows pump 31 into the chemical solution injection system. Chemical solution is withdrawn at a rate of 1.0 ml/sec to the chemical solution system from bellows pump 31 during chemical solution replenishment.

It is preferable that a liquid drawoff port 34 be provided in bellows pump 31, and by means of this liquid drawoff port 34, chemical solution can be drawn off at a flow rate of a few ml/min so that the particles generated by the operation of the bellows do not reach the chemical solution injection system.

EMBODIMENT 5

Figure 5:
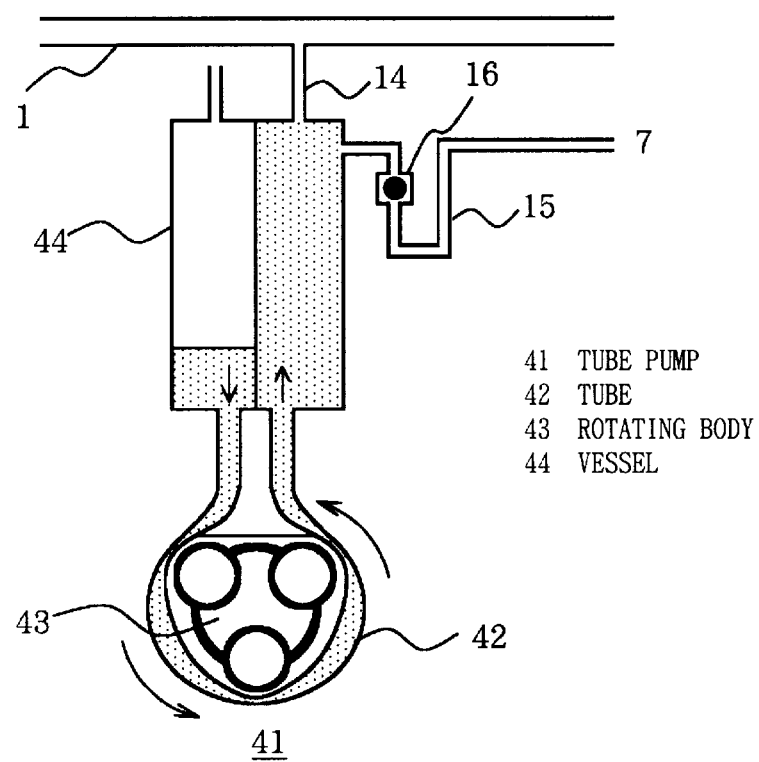
FIG. 5 is a cross sectional view showing the control system for pressurization and depressurization in embodiment 5.

In embodiment 5, as shown in FIG. 5, a [control system for pressurization and depressurization] comprising a tube pump is employed, and the remainder of the structure of the apparatus for injecting constant quantitative chemicals is identical to that of embodiment 1.

First, the structure and function of the tube pump will be explained. Tube pump 41 comprises tube 42 and rotating body 43; such pumps are commonly employed, and operate on principles such that, while moving the pressure-deformed part of the elastic tube 42 by means of rotating body 43, liquid is taken up from one end of the tube and sent out the other end, so that the liquid is moved. In the present invention, the liquid moving principle of this tube pump is characteristically employed as a "special condition of repeating reciprocal inversion".

The pressurization control of this tube pump by means of the reciprocal inversion function will be explained in a sequence in which, in the case of continuous cleaning of wafers at 60 second intervals, the injection of chemical solution A is conducted for a period of 20 seconds at a rate of 1.0 ml/sec, and chemical solution replenishment is conducted for the remaining 40 seconds. One end of the tube is connected to the chemical solution injection system, while the other end is connected to the open receptacle 44 of the chemical solution. The structure of the injection control system and the chemical solution replenishment system is identical to that in FIGS. 1 and 2.

The tube pump operates according to a program in which, at 60 second intervals, it rotates in one direction for a period of 20 seconds, and then rotates in the other direction for a period of 20 seconds. By means of the first rotation, 20 ml of chemical solution A is injected into the ultra pure water flow path from the chemical solution injection system for a period of 20 seconds, and as a result of the reverse rotation, 20 ml of chemical solution A flows into the chemical solution injection system over a period of 20 seconds, opening the check valve 16 of the chemical solution replenishment system.

The pressure of the chemical solution replenishment system container should be maintained at a constant pressure somewhat lower than that of the ultra pure water pressure. In this reciprocal inversion program operation, the time gap sequence is important. For example, rotation is conducted for a period of 20.0 seconds, and reverse rotation is conducted for a period of 20.5 seconds to produce a time gap of 0.5 seconds. At this time, 0.5 ml/60 seconds of chemical solution A is drawn off to the side of receptacle 44 from the tube pump, and by means of this, the chemical solution moving back and forth within the tube is completely recharged after approximately 40 minutes.

The particulate contamination arising as a result of the pressurizing of the tube is slight, and at this type of time gap, no increase in particle levels could be determined in chemical solution A. The time gap sequence is an effective and reliable mechanism for accomplishing clean injection.

EMBODIMENT 6

Figure 6:
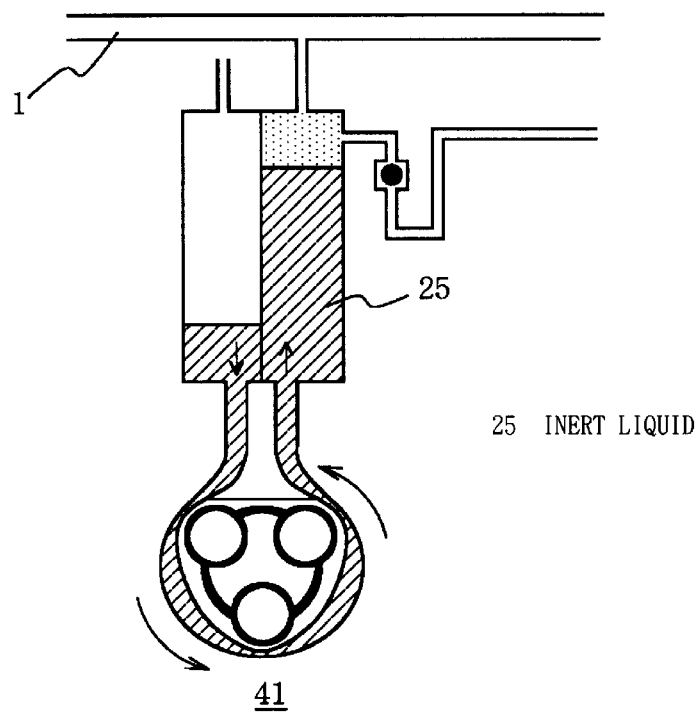
FIG. 6 is a cross sectional view showing the control system for pressurization and depressurization in embodiment 6.

In embodiment 6, as shown in FIG. 6, a [control system for pressurization and depressurization] comprising a tube pump 41 is employed, and the rest of the apparatus for injecting constant quantitative chemicals is identical to that of embodiment 1.

In the present embodiment, the tube pump 41 is filled with a perfluoro compound solution 25. The perfluoro compound solution is completely nonreactive to and immiscible with aqueous solutions, so that an interface layer with the chemical solution is formed. By means of this, there is no effect of the generation of particles as a result of the tube pump drive, and the cleanliness of the chemical injection system can be completely maintained. In place of the perfluoro compound 25, an aqueous solution having a greater density may be used as the liquid filling the tube pump 41, and a three-layered structure may be provided by positioning the perfluoro compound layer at the interface layer with the chemical solution.

EMBODIMENT 7

Figure 7:
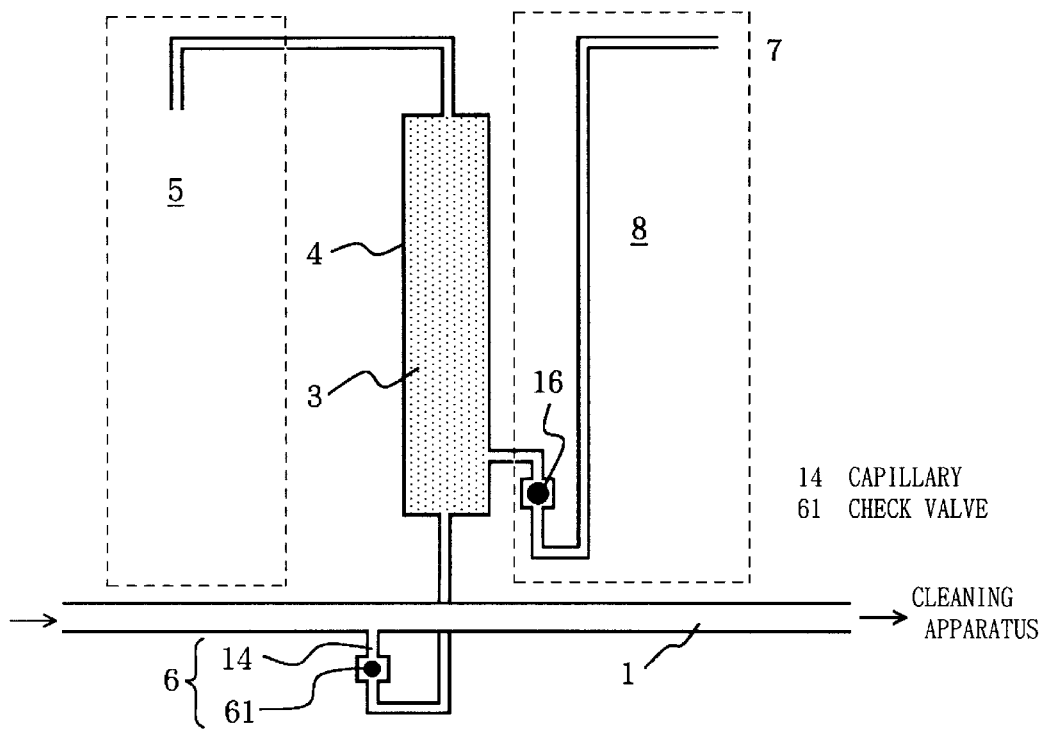
FIG. 7 is a schematic system diagram of an apparatus for injecting constant quantitative chemicals in accordance with embodiment 7.

In embodiment 7, as shown in FIG. 7, an apparatus for injecting constant quantitative chemicals is provided which has an [injection control system] comprising a combination of a capillary 14 and a check valve 61. By means of this combination, it is possible to combine the following two functions.

(1) The two functions are: (1) the instantaneous mixing function of the chemical solution 3 and the ultra pure water within the ultra pure water flow path 1 resulting from the spraying function of the capillary 14 during chemical solution injection, and (2) the chemical solution injection stopping function resulting from the closure of check valve 61 as a result of the ultra pure water pressure during chemical solution replenishment.

When capillary 14 has an inner diameter of 0.50 mm, and a length of 40 mm, the capillary resistance of this capillary 14 is 0.25 kg/cm$^3$ when the aqueous solution passes through at a flow rate of 1.00 ml/sec. Check valve 61 functions with respect to the stoppage of the injection of the chemical solution into ultra pure water flow path 1, so that it is possible to set the capillary resistance at a low level.

EMBODIMENT 8

Wafer cleaning was executed by means of various cleaning compositions, connecting a small-volume direct injection apparatus to the single wafer processing type apparatus.

In other words, any of the apparatuses for injecting constant quantitative chemicals depicted in FIGS. 1 through 6 are connected to one end of the ultra pure water flow path in a number equal to that of the types of chemical solutions, and by means of conducting mixing of the cleaning solution compositions by controlling the injection rate of the various chemical solutions, the cleaning formula can be arbitrarily altered where necessary. It is possible to inject a constantly clean chemical solution without preparing and supplying a large amount of chemical solution in advance.

The ability to use metallic materials as the various structural materials used in the chemical solution supplying apparatus is extremely important. Metallic materials are much more useful than other materials in terms of the strength and precise workability thereof. However, in chemical solution systems requiring an extremely high degree of cleanliness, complete passivation must be carried out with respect to the chemical effects resulting from the chemical solution and the gas component generated by the chemical solution. Presently, as a result of advances in fluoride passivation treatment technology, it has become possible to form a minute film of iron fluoride, aluminum fluoride, magnesium—aluminum fluoride, and nickel fluoride or the like on the surface of stainless steel, aluminum alloy, or the like, and thus to form a complete barrier to corrosive gases and liquids.

In the present invention, the metallic materials having such fluoride passivation treated surfaces are employed, and this increases the effects of the present invention. For example, fluoride passivation treated aluminum alloy or fluoride passivation treated stainless steel is employed in the surfaces in contact with gas among the materials of the gas supply system of the [control system for pressurization and depressurization]. As a result of such a [control system for pressurization and depressurization], when the control of the hydrofluoric acid cleaning solution injection is conducted, the HF vapor pressure of the 50% HF reaches the level of a few Torr, and the gas system has a strongly corrosive atmosphere; however, there is no hindrance to long-term continuous operation, and furthermore, no metallic contamination could be observed at the ppt level in the injected hydrofluoric acid solution.

Furthermore, an aluminum alloy capillary having an inner diameter of 0.5 mm was prepared, and a nickel layer was formed on the surface thereof by the means of non-electrolytic nickel plating, and a nickel fluoride film having a thickness of approximately 1000 Å was formed on the surface of this nickel layer. By adjusting the thickness of the nickel layer at the micrometer level, the inner diameter of the capillary was regulated in a freely determined manner within a range of 0.2–0.5 mm. The nickel fluoride film is completely resistant to all chemical solutions with the exception of strongly alkaline solutions such as caustic soda and the like, and nickel contamination in the injected chemical solution was not observed at the ppt level.

Furthermore, the check valves provided in the chemical solution injection system and the chemical solution replenishing system are produced using a stainless steel ball and a stainless steel valve seat, and after polishing the surfaces thereof to a mirrored surface, an iron fluoride layer having a thickness of approximately 500 Å was formed thereon. The completeness of the seal effect and the non-contamination were sufficient as a result of the precision of the working of the stainless steel and the strength of the iron fluoride layer, as well as the anti-corrosive effects of the fluoride passivation treatment.

In particular, the dramatic effects observed when stainless steel pipes and joints which were subjected to fluoride passivation treatment were used were a reduction in the size of the chemical solution supply apparatus, as well as the leak stability. Conventional resin pipes and resin joints were insufficiently strong, and could not be made completely leak-proof.

What is claimed is:

1. An apparatus for injecting constant quantitative chemical solutions into an ultra pure water flow path, the apparatus comprising:

a chemical solution injecting system having a chemical solution retaining part for retaining the chemical solutions;

a pressurization control system including a control to control pressurization and depressurization of said chemical solution retaining part at standard intervals;

an injection control system which is structured so as to operate in concert with said control of the pressure of said chemical solution, and conducts intermittent injection of chemical solution into the ultra pure water flow path from said chemical solution injection system, said injection control system conducting instantaneous mixing operations, and conducts cessation of injection, said injection control system comprising a capillary which is directly connected with said chemical solution retaining part and the ultra pure water flow path; and a chemical solution replenishment system that include a pipe connected with said chemical solution source said chemical solution injection system, and a check valve provided in said pipe, which is structured so as to operate in concert with said control so as to accomplish replenishment of the chemical solution in said chemical solution retaining part from a chemical solution source.

2. An apparatus for injecting constant quantitative chemicals in accordance with claim 1, wherein the said pressurized control system comprises a gas control system including a gas regulator, a pressure sensor for sensing pressure applied to said chemical solution, and a pressure opening valve.

* * * * *